US010714369B2

(12) United States Patent
Hong

(10) Patent No.: US 10,714,369 B2
(45) Date of Patent: Jul. 14, 2020

(54) MICRO DEVICE TRANSFERRING METHOD AND MICRO DEVICE TRANSFERRING APPARATUS

(71) Applicant: KAISTAR Lighting (Xiamen) Co., Ltd.

(72) Inventor: Steve Mengyuan Hong, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/378,607

(22) Filed: Apr. 9, 2019

(65) Prior Publication Data
US 2019/0393066 A1    Dec. 26, 2019

(30) Foreign Application Priority Data

Jun. 25, 2018 (CN) .......................... 2018 1 0660615

(51) Int. Cl.
| | |
|---|---|
| *H01L 21/677* | (2006.01) |
| *H01L 33/00* | (2010.01) |
| *H01L 21/683* | (2006.01) |
| *B25J 15/06* | (2006.01) |
| *H01L 21/67* | (2006.01) |
| *H01L 25/075* | (2006.01) |

(52) U.S. Cl.
CPC .... *H01L 21/67796* (2013.01); *B25J 15/0625* (2013.01); *H01L 21/67703* (2013.01); *H01L 21/6838* (2013.01); *H01L 33/005* (2013.01)

(58) Field of Classification Search
USPC ....................................................... 156/247
See application file for complete search history.

(56) References Cited

U.S. PATENT DOCUMENTS

2019/0088480 A1*  3/2019  Budd ................. H01L 21/2007

* cited by examiner

*Primary Examiner* — Sing P Chan
(74) *Attorney, Agent, or Firm* — Hemisphere Law, PLLC; Zhigang Ma

(57) ABSTRACT

A micro device transferring method and a micro device transferring apparatus are provided. The micro device transferring method exemplarily includes: providing a carrier substrate including a transparent base, a light radiation activated adhesiveness-loss layer located on a first surface of the transparent base and multiple micro devices arranged in an array on the light radiation activated adhesiveness-loss layer; locally irradiating the light radiation activated adhesiveness-loss layer from a second surface of the transparent base to reduce adhesiveness of multiple target areas of the light radiation activated adhesiveness-loss layer to the micro devices respectively located in the multiple target areas, the multiple target areas being areas corresponding to the micro devices to be transferred; picking up the micro devices in the multiple target areas; and aligning the picked up micro devices with corresponding locations of a receiving substrate, and releasing them onto the receiving substrate.

18 Claims, 7 Drawing Sheets

Providing a carrier substrate, the carrier substrate including a transparent base, a light radiation activated adhesiveness-loss layer located on a first surface of the transparent base, and multiple micro-LED devices arranged in an array on the light radiation activated adhesiveness-loss layer — S11

Locally irradiating the light radiation activated adhesiveness-loss layer from a second surface of the transparent base, to thereby reduce adhesiveness of multiple target areas of the light radiation activated adhesiveness-loss layer to the micro-LED devices respectively located in the multiple target areas — S13

Picking up the micro-LED devices in the multiple target areas — S15

Aligning the micro-LED devices being picked up with corresponding locations of a receiving substrate, and then releasing the micro-LED devices being picked up onto the receiving substrate — S17

S11 — Providing a carrier substrate, the carrier substrate including a transparent base, a light radiation activated adhesiveness-loss layer located on a first surface of the transparent base, and multiple micro-LED devices arranged in an array on the light radiation activated adhesiveness-loss layer S13 — Locally irradiating the light radiation activated adhesiveness-loss layer from a second surface of the transparent base, to thereby reduce adhesiveness of multiple target areas of the light radiation activated adhesiveness-loss layer to the micro-LED devices respectively located in the multiple target areas S15 — Picking up the micro-LED devices in the multiple target areas S17 — Aligning the micro-LED devices being picked up with corresponding locations of a receiving substrate, and then releasing the micro-LED devices being picked up onto the receiving substrate

FIG. 1

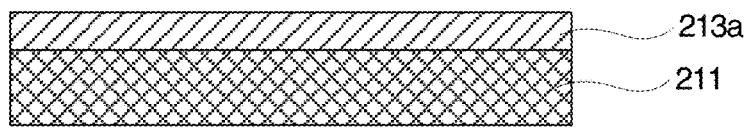

FIG. 2A

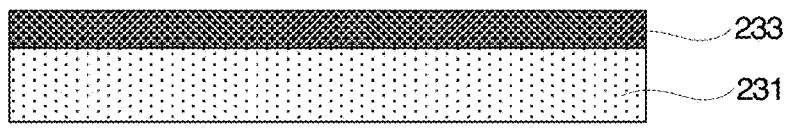

FIG. 2B

MICRO DEVICE TRANSFERRING METHOD AND MICRO DEVICE TRANSFERRING APPARATUS

TECHNICAL FIELD

The invention relates to the technical field of micro devices, and more particularly to a micro device transferring method and a micro device transferring apparatus.

DESCRIPTION OF RELATED ART

As to micro-LED devices, a conventional mass transferring method is usually employed to transfer different micro-LED devices of emitting red, green and blue lights to a same receiving substrate in a specific arrangement, in order to form an available RGB pixel array for display. However, the mass transferring method usually requires multiple transfer heads formed on a transferring apparatus for respectively aligning with multiple micro-LED devices on a carrier substrate, so as to realize picking up and releasing of the multiple micro-LED devices by electricity on-off or magnetism on-off, in other words, using a one-to-one adsorption and pick-up mode. In order to meet the needs of continuous development of the mass transferring of micro-LED devices, it is necessary to optimize the mass transferring method of micro-LED devices.

SUMMARY

Accordingly, the invention provides a micro device transferring method and a micro device transferring apparatus, so as to optimize the mass transferring method of micro devices.

Specifically, an embodiment of the invention provides a micro device transferring method including steps of: (a) providing a carrier substrate, the carrier substrate including a transparent base, a light radiation activated adhesiveness-loss layer disposed on a first surface of the transparent base, and a plurality of micro devices arranged in an array on the light radiation activated adhesiveness-loss layer; (b) locally irradiating the light radiation activated adhesiveness-loss layer from a second surface of the transparent base to thereby reduce adhesiveness of a plurality of target areas of the light radiation activated adhesiveness-loss layer to the micro devices respectively located in the plurality of target areas, wherein the plurality of target areas are areas corresponding to the micro devices to be transferred; (c) picking up the micro devices located in the plurality of target areas; and (d) aligning the micro devices being picked up with corresponding locations of a receiving substrate, and then releasing the micro devices being picked up onto the receiving substrate.

In an embodiment of the invention, the step of providing a carrier substrate includes: providing a micro device layer formed on a first base; providing the light radiation activated adhesiveness-loss layer formed on the transparent base; bonding the micro device layer with the light radiation activated adhesiveness-loss layer to obtain a bonded structure, wherein the first base is located at a side of the micro device layer facing away from the light radiation activated adhesiveness-loss layer, and the transparent base is located at a side of the light radiation activated adhesiveness-loss layer facing away from the micro device layer; stripping off the first base from the bonded structure to obtain a stripped structure; and dividing the micro device layer of the stripped structure into the plurality of micro devices arranged in an array on the light radiation activated adhesiveness-loss layer, to obtain the carrier substrate.

In an alternative embodiment of the invention, the step of providing a carrier substrate includes: providing the plurality of micro devices formed on a first base; providing the light radiation activated adhesiveness-loss layer formed on the transparent base; bonding the plurality of micro devices with the light radiation activated adhesiveness-loss layer to obtain a bonded structure, wherein the first base is located at a side of the plurality of micro devices facing away from the light radiation activated adhesiveness-loss layer, and the transparent base is located at a side of the light radiation activated adhesiveness-loss layer facing away from the plurality of micro devices; and stripping off the first base from the bonded structure, to obtain the carrier substrate.

In an embodiment of the invention, the light radiation activated adhesiveness-loss layer is one of an ultraviolet radiation activated adhesiveness-loss layer and an infrared radiation activated adhesiveness-loss layer.

In an embodiment of the invention, the step of locally irradiating the light radiation activated adhesiveness-loss layer from a second surface of the transparent base includes: using a surface light radiation cooperating with a mask to achieve locally irradiating the light radiation activated adhesiveness-loss layer from the second surface of the transparent base, or using a radiation light beam to perform a two-dimensional scanning onto the light radiation activated adhesiveness-loss layer from the second surface of the transparent base.

In another aspect, an embodiment of the invention provides a micro device transferring apparatus including: a light radiation device, configured (i.e., structured and arranged) for providing a surface light radiation; a carrier substrate fixing device, configured for fixing a carrier substrate; a mask fixing device, configured for fixing a mask on an optical path of the surface light radiation to make the surface light radiation locally irradiate the carrier substrate; and an absorbing device, configured for picking up micro devices located in a plurality of target areas irradiated by the surface light radiation on the carrier substrate and transferring the micro devices being picked up onto a receiving substrate.

In an embodiment of the invention, the light radiation device includes one of an ultraviolet radiation source and an infrared radiation source.

In an embodiment of the invention, the mask is a replaceable mask, positions of light transmitting portions of the mask are fixed but the mask is replaceable by another different mask so as to achieve irradiation of different target areas.

In an embodiment of the invention, the mask is a variable mask located between the light radiation device and the carrier substrate fixing device and configured for allowing the surface light radiation to locally irradiate the carrier substrate, and positions of light transmitting portions of the variable mask are variable.

In an embodiment of the invention, the variable mask includes an optical switch.

In an embodiment of the invention, the optical switch is a liquid crystal light valve array.

In an embodiment of the invention, the micro device transferring apparatus is applied for transferring micro devices on the carrier substrate containing a light radiation activated adhesiveness-loss layer, and adhesiveness of the plurality of target areas is reduced after being irradiated by the surface light radiation.

In still another aspect, an embodiment of the invention provides a micro device transferring apparatus includes: a carrier substrate fixing device, configured for fixing a carrier substrate; a scanning-type light radiation device, configured for providing a radiation light beam to perform a two-dimensional scanning on the carrier substrate from a first side of the carrier substrate; and an absorbing device, configured for picking up micro devices in a plurality of target areas irradiated by the radiation light beam on the carrier substrate from a second side opposite to the first side, and transferring the micro devices being picked up onto a receiving substrate.

In an embodiment of the invention, the scanning-type light radiation device includes one of an ultraviolet radiation source and an infrared radiation source.

In an embodiment of the invention, the micro device transferring apparatus is applied for transferring micro devices on the carrier substrate containing a light radiation activated adhesiveness-loss layer, and adhesiveness of the plurality of target areas is reduced after being irradiated by the radiation light beam.

Sum up, the embodiments of the invention employ a light radiation activated adhesiveness-loss layer and even a vacuum absorbing to achieve a mass transfer of micro devices, which can realize accurate picking up of micro devices with different spacings by simply replacing a mask or adjusting a variable mask, and thus can achieve technical effects of simple process and simplifying the process. Moreover, micro device transferring apparatuses suitable for transferring the micro devices are also provided, so as to achieve the purpose of optimizing the transfer of micro devices.

BRIEF DESCRIPTION OF THE DRAWINGS

In order to more clearly illustrate technical solutions of embodiments of the invention, drawings used in the description of the embodiments will be briefly described below. Apparently, the drawings described below are merely some embodiments of the invention, those skilled in the art can also obtain other drawings based on these drawings without creative efforts.

FIG. 1 is a schematic flowchart of a micro-LED device transferring method according to a first embodiment of the invention.

FIGS. 2A-2F are structural schematic views relevant to the step S11 in FIG. 1.

DETAILED DESCRIPTION OF PREFERRED EMBODIMENTS

The technical solutions in the embodiments of the invention will be clearly and completely described below with reference to the accompanying drawings in the embodiments of the invention. Apparently, the described embodiments are merely some of the embodiments of the invention, not all embodiments. Based on the described embodiments of the invention, all other embodiments obtained by those skilled in the art without creative efforts fall are within the scope of protection of the invention.

First Embodiment

Referring to FIG. 1, a micro-LED device transferring method provided by a first embodiment of the invention includes following steps S11, S13, S15 and S17.

S11: providing a carrier substrate, the carrier substrate including a transparent base, a light radiation activated adhesiveness-loss layer located on a first surface of the transparent base, and multiple (i.e., more than one) micro-LED devices arranged in an array on the light radiation activated adhesiveness-loss layer.

S13: locally irradiating the light radiation activated adhesiveness-loss layer from a second surface of the transparent base, to thereby reduce adhesiveness of multiple target areas of the light radiation activated adhesiveness-loss layer to the micro-LED devices respectively located in the multiple target areas.

S15: picking up the micro-LED devices in the multiple target areas.

S17: aligning the micro-LED devices being picked up with corresponding locations of a receiving substrate, and releasing the micro-LED devices being picked up onto the receiving substrate.

In order to more clearly understand the first embodiment of the invention, the steps S11, S13, S15 and S17 will be described below in detail with reference to FIGS. 2A-2F, FIG. 3 and FIGS. 4A-4B.

Figure 2C:
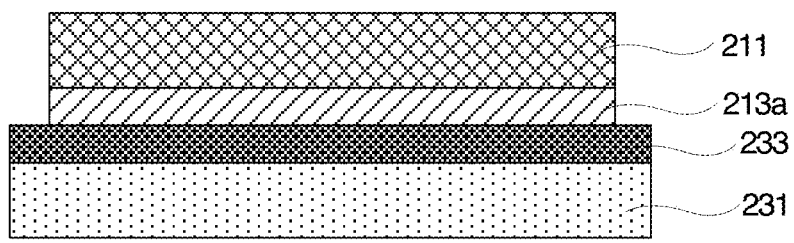
Figure 2D:
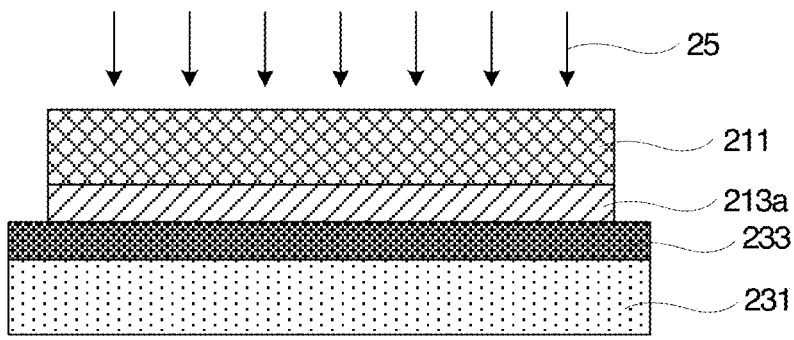
Figure 2E:
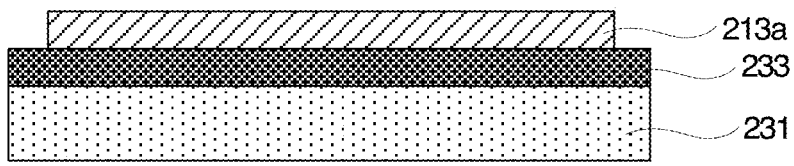
Figure 2F:
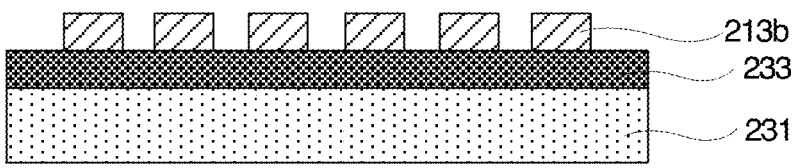

In particular, as to the step S11, FIG. 2A through FIG. 2F can be referred. Firstly, as illustrated in FIG. 2A, a light emitting diode (LED) layer 213a is formed on a sapphire base 211. Herein, the LED layer 213a exemplarily includes a buffer layer (e.g., GaN layer), N doped layer, a light emitting layer and a P doped layer, and the light emitting layer usually is one or more quantum well layers. It can be understood by the skilled in the art that the layer structure of the LED layer 213a is not limited to this, and the sapphire base 211 can be replaced by other base of a suitable material. In another aspect, as illustrated in FIG. 2B, a UV (ultraviolet) radiation activated adhesiveness-loss layer 233 is formed on an upper surface (first surface) of a transparent base e.g., glass base 231. Herein, the UV radiation activated adhesiveness-loss layer 233 may be an existing UV radiation adhesiveness-loss tape, for example, the UV radiation activated adhesiveness-loss tape contains the following components by weight percentage: UV adhesive 38%-80%, curing additive 0.5%-2.5%, ethyl ester 9%-20% and methylbenzene 10%-40%. Subsequently, as illustrated in FIG. 2C, the LED layer 213a formed on sapphire base 211 is bonded with the UV radiation activated adhesiveness-loss layer 233 formed on the upper surface of the glass base 231 to achieve bonding. Afterwards, as illustrated in FIG. 2D, laser light beams 25 are used to irradiate the bonded structure as shown in FIG. 2C from a side of the sapphire base 211 facing away from the LED layer 213a, so as to strip off the sapphire base 211, to thereby obtain a stripped structure as shown in FIG. 2E. Then, as illustrated in FIG. 2F, after stripping off the sapphire base 211, the LED layer 213a is divided into discrete micro-LED devices 213b, e.g., by an etching method. As a result, an array of micro-LED devices 213b arranged in rows and columns is formed on the UV radiation activated adhesiveness-loss layer 233, and the array of micro-LED devices 213b is adhered onto the upper surface of the glass base 231 by the UV radiation activated adhesiveness-loss layer 233, and thereby the purpose of providing a carrier substrate is achieved.

Figure 3:
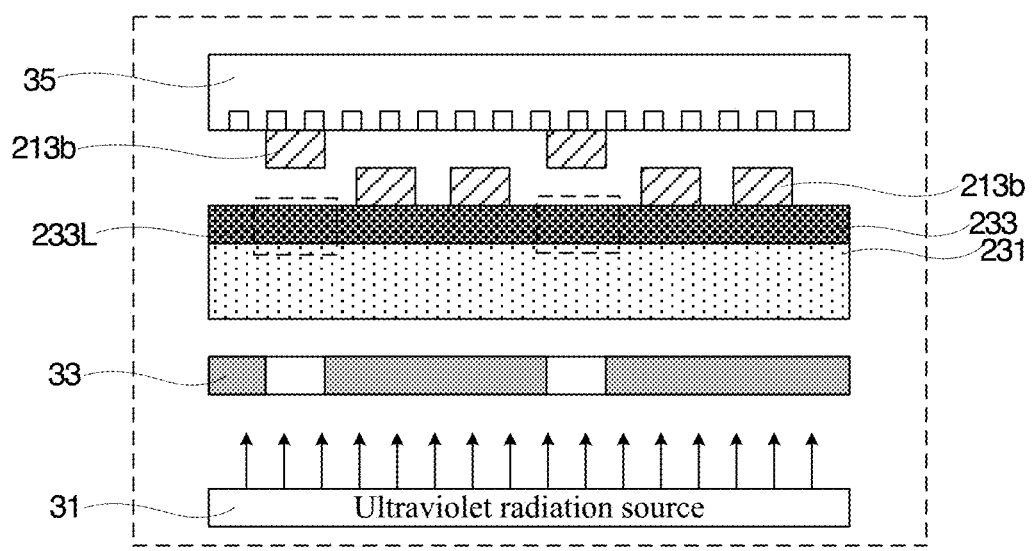
FIG. 3 is a structural schematic view relevant to the step S13 and the step S15 in FIG. 1.

As to the step S13, referring to FIG. 3, an ultraviolet radiation source 31 is used to generate ultraviolet light (a wavelength thereof for example is in a range of 190 nm-400 nm, a radiation intensity for example is greater than 1 mW/cm$^2$). The ultraviolet light cooperating with a mask 33 locally irradiates the UV radiation activated adhesiveness-loss layer on the carrier substrate from a second surface (lower surface) of the glass base 231 of the carrier substrate. The ultraviolet light passes through light transmitting portions (may be transparent portions or hollow portions) of the mask 33 and then arrives at the UV radiation activated adhesiveness-loss layer 233 on the carrier substrate, so as to reduce adhesiveness of multiple target areas 233L of the UV radiation activated adhesiveness-loss layer 233 to micro-LED devices 213b respectively located in the multiple target areas 233L, for example, make the target areas 233L completely lost their adhesiveness or make the adhesiveness of the target areas to the micro-LED devices 213b be reduced to sufficiently small, so that the micro-LED devices 213b in the target areas 233L are separated from the UV radiation activated adhesiveness-loss layer 233 under the effect of a certain pickup force, while the micro-LED devices in other areas without being irradiated by the ultraviolet light still are adhered by the UV radiation activated adhesiveness-loss layer 233 and thus not separated from the UV radiation activated adhesiveness-loss layer 233 under the effect of the certain pickup force.

As to the step S15, referring to FIG. 3 again, a vacuum absorbing device 35 is used to pick up the micro-LED devices 213b in the areas 233L being irradiated by the ultraviolet light on the UV radiation activated adhesiveness-loss layer 233 from the upper side of the carrier substrate. Herein, the magnitude of an adsorption force (or referred to as pickup force) of the vacuum absorbing device 35 can be flexibly designed according to actual requirements, but necessarily satisfies the following condition that: can pick up the micro-LED devices 213b in the areas 233L irradiated by the ultraviolet light on the UV radiation activated adhesiveness-loss layer 233 while does not pick up the micro-LED devices 213b in the areas without being irradiated by the ultraviolet light on the UV radiation activated adhesiveness-loss layer 233.

Figure 4A:
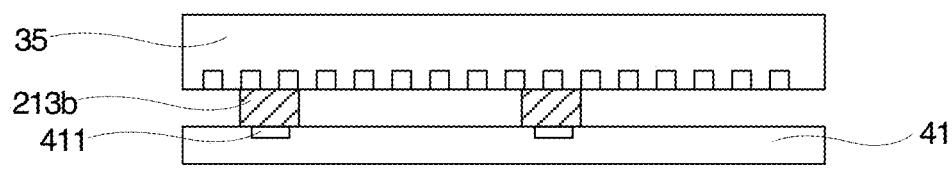
FIGS. 4A-4B are structural schematic views relevant to the step S17 in FIG. 1.
Figure 4B:
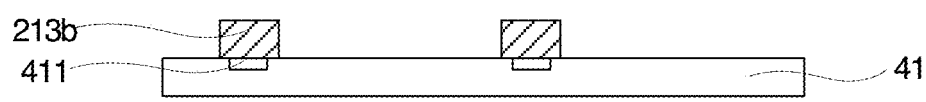

As to the step S17, FIG. 4A and FIG. 4B can be referred. Firstly, referring to FIG. 4A, the micro-LED devices 213b picked up by the vacuum absorbing device 35 are aligned with corresponding locations 411 of a receiving substrate 41. Afterwards, as illustrated in FIG. 4B, the picked up micro-LED devices are released onto the corresponding locations 411 of the receiving substrate 41, and thereby achieving the transfer of the multiple micro-LED devices 213b. Herein, it is noted that: the receiving substrate 41 for example is a display substrate (i.e., a driving board applied for a display device, or a light emitting substrate (i.e., a driving boarder applied for an lighting device) and so on, on which a necessary electrical circuitry is disposed. Regarding each the micro-LED device 213b, when it is a vertical LED chip, each the corresponding location 411 of the receiving substrate 41 for example is formed with a single electrical connection point for electrically connected with one of a positive electrode and a negative electrode of the micro-LED device 213b, and when it is a flip LED chip, the corresponding location 411 of the receiving substrate 41 for example is formed with one pair of electrical connection points for electrically connected with a positive electrode and a negative electrode of the micro-LED chip 213b respectively.

Sum up, the first embodiment of the invention firstly transfers the LED layer 213a onto the UV radiation activated adhesiveness-loss layer 233 and then divides the LED layer 213a into an array of discrete micro-LED devices 213b, which is beneficial to the reliability of transferring the array of micro-LED devices 213b onto the UV radiation activated adhesiveness-loss layer 233. Moreover, an ultraviolet light is used to locally irradiate the UV radiation activated adhesiveness-loss layer 233 to reduce adhesiveness of the micro-LED devices 213b located in the target areas 233L, and micro adsorption pores of the vacuum absorbing device 35 are used to pick up the micro-LED devices 213b in the target areas 233L but the micro-LED devices outside the target areas 233L are not picked up by the vacuum absorbing device 35 owning to strong adhesion of the UV radiation activated adhesiveness-loss layer 233, and thereby achieving batch transfer of the micro-LED devices. In addition, since the vacuum absorbing device 35 is used to perform the picking up operation, which is different from the prior art that transfer heads are used to absorb and pick up in one-to-one manner (i.e., picking up by transfer heads in an accurate alignment manner), and can realize absorbing and picking up in a one-to-many manner (i.e., does not design transfer heads additionally), and therefore alignment difficulty and cost of mass transfer can be reduced.

Second Embodiment

Figure 5:
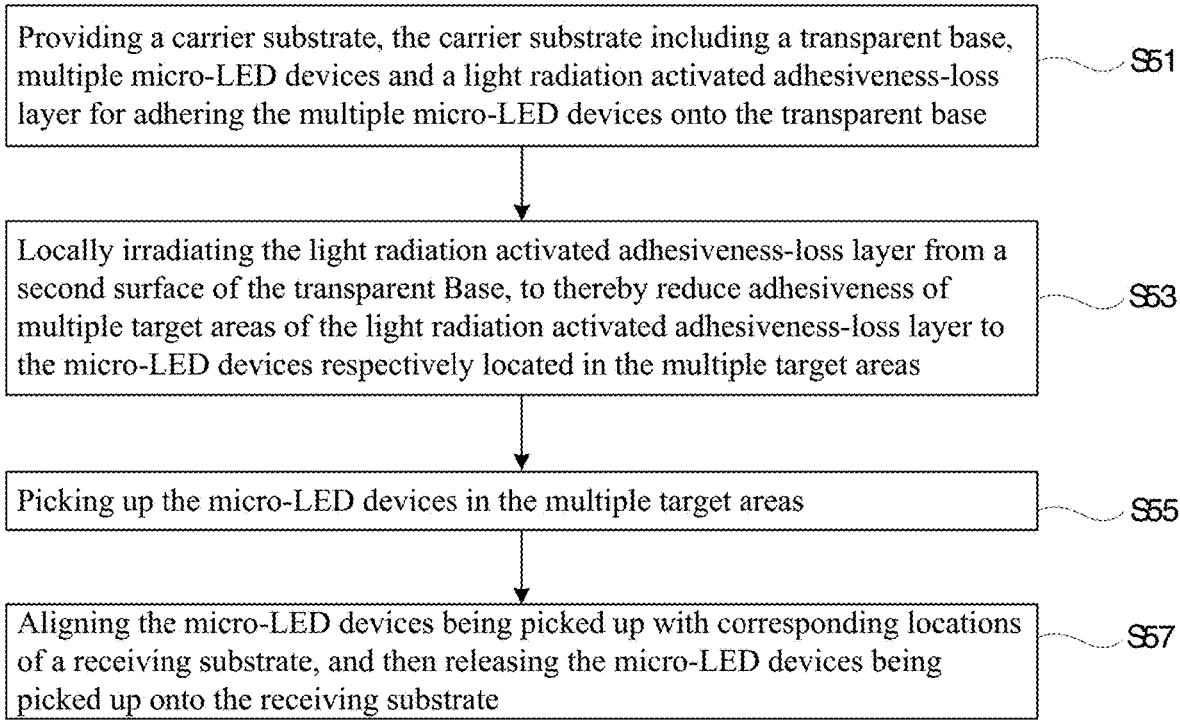
FIG. 5 is a schematic flowchart of a micro-LED device transferring method according to a second embodiment of the invention.

Referring to FIG. 5, a second embodiment of the invention provides a micro-LED device transferring method including the following steps S51, S53, S55 and S57.

S51: providing a carrier substrate, the carrier substrate including a transparent base, multiple micro-LED devices and a light radiation activated adhesiveness-loss layer for adhering the multiple micro-LED devices onto the transparent base.

S53: locally irradiating the light radiation activated adhesiveness-loss layer from a second surface of the transparent base to thereby reduce adhesiveness of multiple target areas of the light radiation activated adhesiveness-loss layer to the micro-LED devices located in the multiple target areas.

S55: picking up the micro-LED devices in the multiple target areas.

S57: aligning the micro-LED devices being picked up with corresponding areas of a receiving substrate and releasing the micro-LED devices being picked up onto the receiving substrate.

In order to more clearly understand the second embodiment of the invention, the steps S51, S53, S55 and S57 will be described below in detail with reference to FIGS. 6A-6E, FIG. 7 and FIGS. 8A-8B.

Figure 6A:
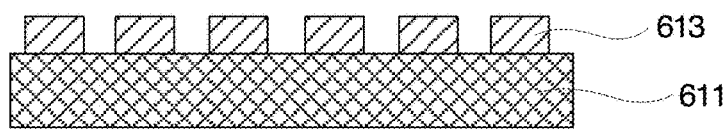
FIGS. 6A-6E are structural schematic views relevant to the step S51 in FIG. 5.
Figure 6B:
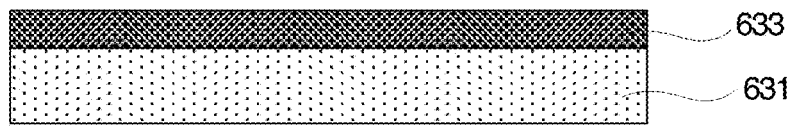
Figure 6C:
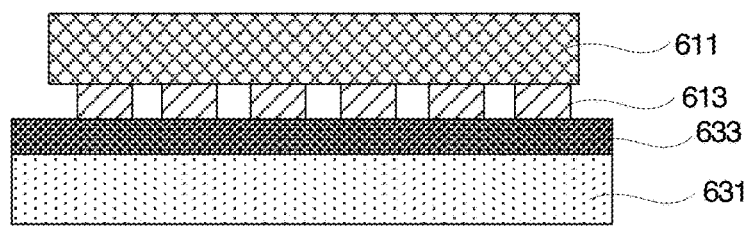
Figure 6D:
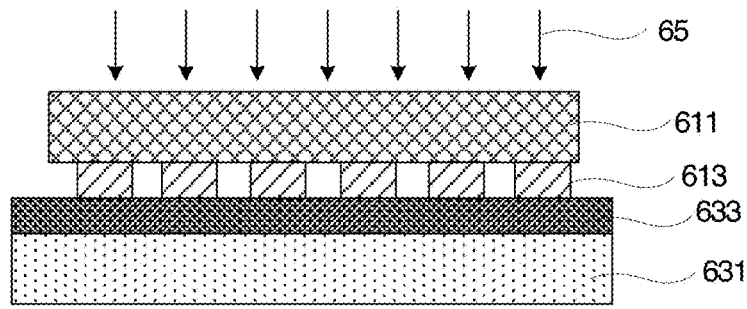
Figure 6E:
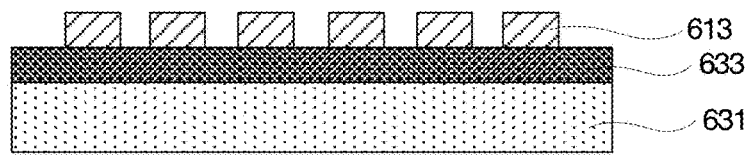

Specifically, as to the step S51, FIGS. 6A-6E can be referred. Firstly, referring to FIG. 6A, a light emitting diode (LED) layer (not shown) is formed on a sapphire base 611, and the LED layer then is divided into multiple discrete micro-LED devices 613 for example by inductively coupled plasma etching, and as a result an array of micro-LED devices 613 are obtained. Herein, the LED layer exemplarily includes e a buffer layer (e.g., GaN layer), N doped layer, a light emitting layer and a P doped layer, and the light emitting layer usually is one or more quantum well layers. It can be understood by the skilled in the art that the layer structure of the LED layer is not limited to this, and the sapphire base 611 can be replaced by other base of a suitable material. In another aspect, as illustrated in FIG. 6B, an IR (infrared) radiation activated adhesiveness-loss layer 633 is formed on a first surface (an upper surface) of a transparent base e.g., glass base 631. Herein, the IR radiation activated adhesiveness-loss can employ an existing thermal tape. For example, the thermal tape is made from raw materials with the following weight percentages: polymer polymethacrylate 20.0%-40.0%, organic solvent 69.5%-38.5%, curing agent 0.5%-1.5% and thermal expansion additive 10.0%-20.0%. Subsequently, as illustrated in FIG. 6C, the multiple micro-LED devices 613 formed o the sapphire base 611 and the IR radiation activated adhesiveness-loss layer 633 formed on the upper surface of the glass base 631 are bonded together, to achieve bonding. Afterwards, as illustrated in FIG. 6D, laser light beams 65 are used to irradiate the bonded structure as illustrated in FIG. 6C from a side of the sapphire base 611 facing away from the micro-LED devices 613, so as to strip off the sapphire base 611 to thereby obtain the structure as shown in FIG. 6E, so that the purpose of providing a carrier substrate is achieved.

Figure 7:
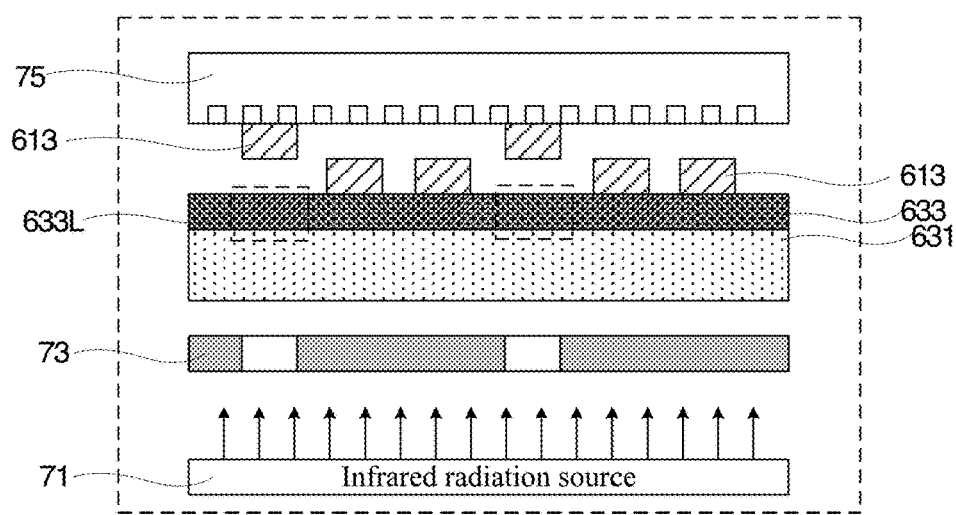
FIG. 7 is a structural schematic view relevant to the step S53 and the step S55 in FIG. 5.

As to the step S53, referring to FIG. 7, cooperating with a mask 73, an IR radiation source 71 is used to generate IR light rays for locally irradiating the IR radiation activated adhesiveness-loss layer 633 from a second surface (lower surface) of the glass base 631 of the carrier substrate, and the IR light rays pass through the light transmitting portions (may be transparent portions or hollow portions) of the mask 73 and arrive at the IR radiation activated adhesiveness-loss layer 633 on the carrier substrate, so as to reduce adhesiveness of multiple target areas 633L of the IR radiation activated adhesiveness-loss layer 633 to the micro-LED devices 613 respectively located in the multiple target areas 633L, for example, making the target areas 633L completely lose the adhesiveness or making the adhesiveness of the target areas 633L to the micro-LED devices 613 be reduced to sufficiently small, so that the micro-LED devices 613 in the target areas 633L can be separated from the IR radiation activated adhesiveness-loss layer 633 at a certain pickup force, while the micro-LED devices 613 in the areas without being irradiated by the IR light rays are still adhered by the IR radiation activated adhesiveness-loss layer 633 and thus are not separated from the IR radiation activated adhesiveness-loss layer 633.

As to the step S55, referring to FIG. 7 again, a vacuum absorbing device 75 is used to pick up the micro-LED devices 613 in the areas 633L irradiated by the IR light rays on the IR radiation activated adhesiveness-loss layer 633 from the upper side of the carrier substrate. Herein, an magnitude of an adsorption force (also referred to as pickup force) of the vacuum absorbing device 75 can be flexibly set according to actual requirements, but ought to satisfy the condition that: can pick up (also referred to as grab up) the micro-LED devices 613 in the areas 633L irradiated by the IR light rays on the IR radiation activated adhesiveness-loss layer 633 while would not pick up the micro-LED devices 613 in the areas without being irradiated by the IR light rays on the IR radiation activated adhesiveness-loss layer 633.

Figure 8A:
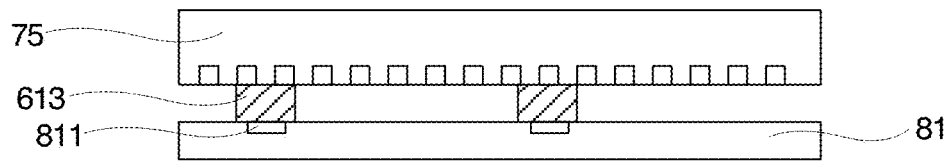
FIGS. 8A-8B are structural schematic views relevant to the step S57 in FIG. 5.
Figure 8B:
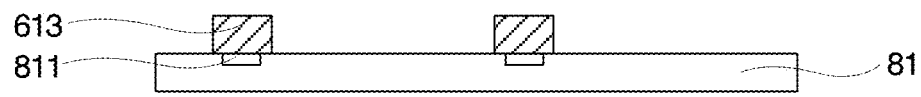

As to the step S57, FIG. 8A and FIG. 8B can be referred. Firstly, referring to FIG. 8A, a vacuum absorbing device 75 is used to align the micro-LED devices 613 being picked up with corresponding locations 811 of a receiving substrate 81, and then referring to FIG. 8B, the micro-LED devices 613 being picked up are released onto the corresponding locations 811 of the receiving substrate 81, so as to realize the transfer of the multiple micro-LED devices 613. Herein, it is noted that, the receiving substrate 81 may be a display substrate (i.e., a driving board applied for a display device), or a light emitting substrate (i.e., a driving board applied for a lighting device) and so on, on which a necessary electrical circuitry is disposed. Regarding each the micro-LED device 613, if it is a vertical LED chip, each the corresponding location 811 of the receiving substrate 81 for example is disposed with a single electrical connection point to electrically connect with one of a positive electrode and a negative electrode of the micro-LED device 613, and if it is a flip LED chip, the corresponding location 811 of the receiving substrate 81 for example is disposed with one pair of electrical connection points to electrically connect with a positive electrode and a negative electrode of the micro-LED device 613 respectively.

In summary, the second embodiment of the invention firstly transfers the array of discrete micro-LED devices 613 onto the IR radiation activated adhesiveness-loss layer 633, and the IR light rays then are used to locally irradiate the IR radiation activated adhesiveness-loss layer 633 to reduce the adhesiveness of the target areas 633L to the micro-LED devices 613 in the target areas 633L (based on thermal effect of infrared light), and further micro adsorption pores of the vacuum absorbing device 75 are used to pick up the micro-LED device 613 in the target areas 633L while the micro-LED devices 613 outside the target areas 633L are not picked up by the vacuum absorbing device 75 owing to strong adhesion of the IR radiation activated adhesiveness-loss layer 633, and as a result batch transfer of micro-LED devices is achieved. In addition, since the vacuum absorbing device 75 is used to perform the picking up operation, which is different from the prior art that transfer heads are used to perform absorb and pick up in one-to-one manner (i.e., picking up by transfer heads in an accurate alignment), and thus can achieve absorbing and picking up in one-to-many manner (i.e., does not design the transfer heads additionally), and thereby reducing alignment difficulty and cost of mass transfer.

Furthermore, it is noted that, in the foregoing first embodiment and the second embodiment, the stripping off the sapphire base 211/611 is not limited to laser lift-off, and can be replaced by chemical stripping or grinding stripping, etc. Moreover, the method of firstly bonding the LED layer 213a with the UV radiation activated adhesiveness-loss layer 233 together and then dividing the LED layer 213a into discrete micro-LED devices 213 in the foregoing first embodiment can be replaced by that firstly dividing the LED layer into discrete micro-LED devices and then bonding the discrete micro-LED devices with the UV radiation activated adhesiveness-loss layer 233. Similarly, the manner of bonding discrete micro-LED devices 613 with the IR radiation activated adhesiveness-loss layer 633 in the foregoing second embodiment can be replaced by that firstly bonding the LED layer for forming discrete micro-LED devices 613 with the IR radiation activated adhesiveness-loss layer 633 and then dividing the LED layer. In addition, the micro-LED device transferring method in any one of the foregoing first embodiment and second embodiment of the invention can be applied for transferring other micro devices, for example, diodes, transistors, ICs, MEMSs and so on. In other words, the micro device transferring method provided by the embodiments of the invention is not limited to the micro-LED device transferring method as illustrated in any one of the foregoing first embodiment and second embodiment, and the LED layer 213a in the foregoing embodiments is an example of a micro device layer. Furthermore, it is noted that, the micro device transferring is not limited to use the vacuum absorbing device to perform the picking up operation as illustrated in the foregoing first embodiment and second embodiment, and can use transfer heads to perform the picking up operation instead.

Third Embodiment

Figure 9:
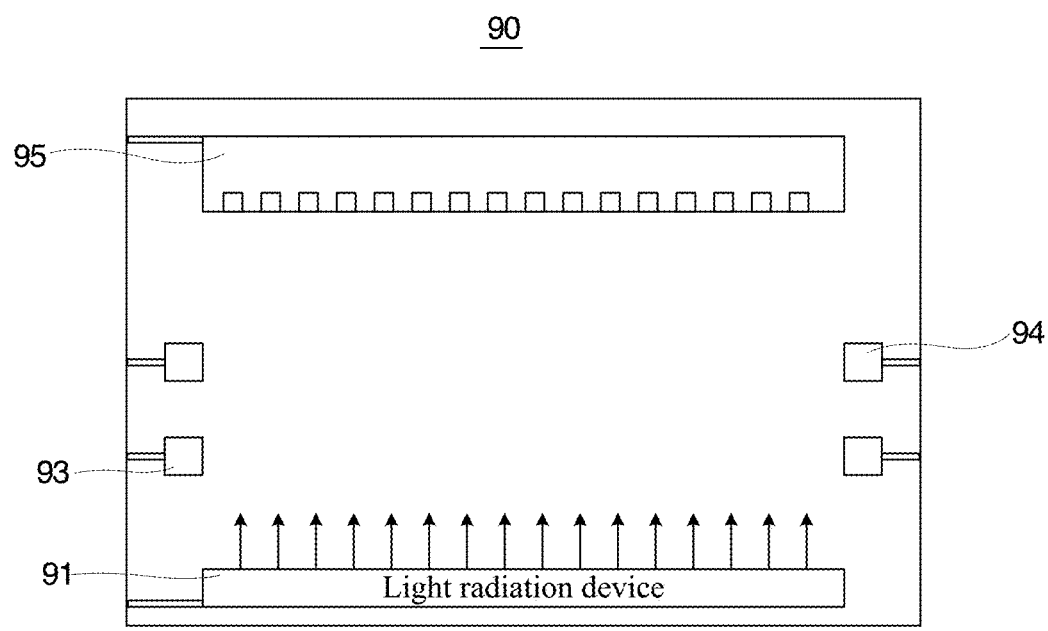
FIG. 9 is a schematic system architecture of a micro device transferring apparatus according to a third embodiment of the invention.

Referring to FIG. 9, a third embodiment of the invention provides a micro device transferring apparatus 90 including: a light radiation device 91, a mask fixing device 93, a carrier substrate fixing device 94, and a picking up and transferring device 95.

The light radiation device 91 for example includes a light radiation source such as an infrared radiation source or an ultraviolet radiation source, and is configured (i.e., structured and arranged) for providing a surface light radiation. The mask fixing device 93 is located between the light radiation device 91 and the carrier substrate fixing device 94, and is configured for fixing a mask on an optical path of the light radiation. According to different requirements of spacing between light transmitting portions, the user can freely replace the mask fixed by the mask fixing device 93, and herein positions of the light transmitting portions of the mask usually are fixed, but it is feasible to achieve irradiating on different target areas by replacing different masks. The carrier substrate fixing device 94 is configured for fixing a carrier substrate between the mask and the picking up and transferring device 95. The carrier substrate typically includes a transparent base and multiple micro-LED devices or other micro devices such as diodes, transistors, ICs or MEMSs adhered onto the transparent base by a light radiation activated adhesiveness-loss layer. The picking up and transferring device 95 is configured for picking up the micro devices in the areas irradiated by the light radiation on the light radiation activated adhesiveness-loss layer of the carrier substrate, and transferring the picked up micro devices to a receiving substrate. In the illustrated embodiment, the picking up and transferring device 95 preferably is a vacuum absorbing device with multiple micro adsorption pores, and thus can achieve absorbing and picking up in one-to-one manner (i.e., does not design transfer heads additionally), and thereby reducing alignment difficulty and cost of mass transferring. Of course, the picking up and transferring device 95 may employ the existing transfer heads for absorbing and picking up in one-to-one manner instead, and achieve the picking up of micro devices by electrostatic adsorption or magnetic adsorption, but the cost of this approach is relatively high. In addition, it is noted that, if the picking up and transferring device 95 employs the vacuum absorbing device, since it can realize absorbing and picking up in one-to-many manner, so that it is compatible with picking up and absorbing of micro device arrays with different micro device spacings and thus can avoid the issue of reproducing new transfer heads resulting from different micro device spacings for micro device arrays, and thereby has a wide application range. Furthermore, as to driving mechanisms for driving the mask fixing device 93, the carrier substrate fixing device 94 and the picking up and transferring device 95 to work and move, they are existing mature technologies and thus will be not described in detail.

Fourth Embodiment

Figure 10:
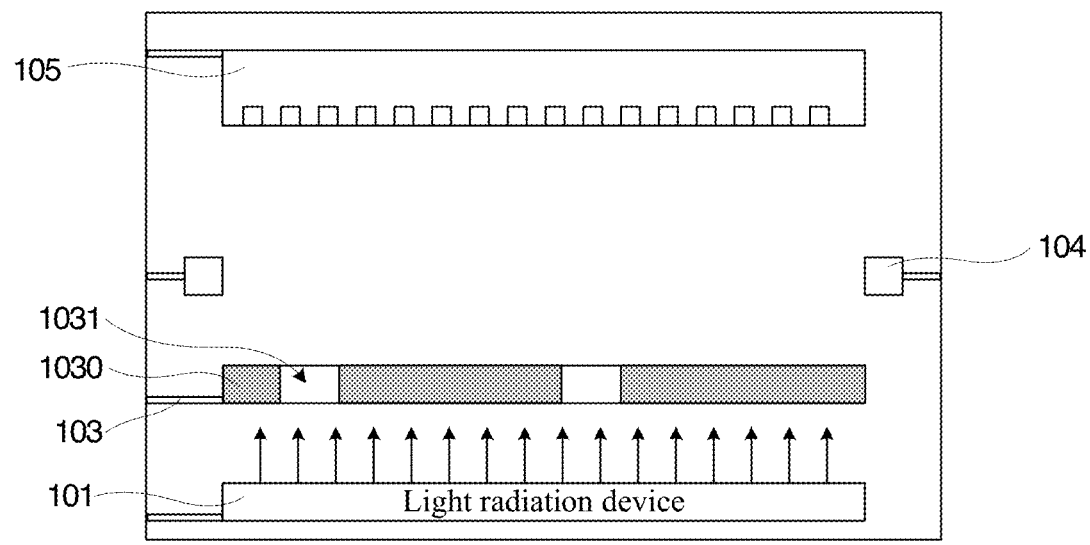
FIG. 10 is a schematic system architecture of a micro device transferring apparatus according to a fourth embodiment of the invention.

Referring to FIG. 10, a fourth embodiment of the invention provides a micro device transferring apparatus 100 including: a light radiation device 101, a mask fixing device 103, a carrier substrate fixing device 104, and a picking up and transferring device 105.

The light radiation device 101 exemplarily includes a light radiation source such as an infrared radiation source or an ultraviolent radiation source, and is configured for providing a surface light radiation. The mask fixing device 103 is disposed between the light radiation device 101 and the carrier substrate fixing device 104, and is configured for fixing a variable mask 1030 on an optical path of the light radiation to facilitate the light radiation to locally irradiate the carrier substrate. Positions of light transmitting portions 1031 of the variable mask 1030 are variable, and the variable mask 1030 allows some of light radiation to pass therethrough. For example, the variable mask 1030 includes an optical switch, such as an infrared liquid crystal light valve array for controlling infrared light to be passed/blocked, or an ultraviolet liquid crystal light valve array for controlling ultraviolet light to be passed/blocked. The carrier substrate fixing device 94 is configured for fixing a carrier substrate between the variable mask 1030 and the picking up and transferring device 105. The carrier substrate typically includes a transparent base and multiple micro-LED devices or other micro devices such as diodes, transistors, ICs, MEMSs adhered onto the transparent base by a light radiation activated adhesiveness-loss layer. The picking up and transferring device 105 is configured for picking up micro devices in the areas irradiated by the light radiation on the light radiation activated adhesiveness-loss layer of the carrier substrate, and transferring the picked up micro devices onto a receiving substrate. In the illustrated embodiment, since the variable mask 1030 is employed, for the mass transfers of micro device arrays with different micro device spacings, there is no need of replacing the mask, and thus can increase the application range of the micro device transferring device 100. The picking up and transferring device 105 preferably adopts a vacuum absorbing device with micro adsorption pores, which can achieve the absorbing and picking up in one-to-many manner (i.e., does not design transfer heads additionally), and thereby can reduce the alignment difficulty and cost of mass transfer. Of course, the picking up and transferring device 105 may employ the existing transfer heads for absorbing and picking up in one-to-one manner instead, and achieve the picking up of micro devices by electrostatic adsorption or magnetic adsorption, but the cost of this approach is relatively high. In addition, it is noted that, if the picking up and transferring device 105 employs the vacuum absorbing device, since it can realize absorbing and picking up in one-to-many manner, so that it is compatible with picking up and absorbing of micro device arrays with different micro device spacings and thus can avoid the issue of reproducing new transfer heads resulting from different micro device spacings for micro device arrays, and thereby has a wide application range. Furthermore, as to driving mechanisms for driving the mask fixing device 103, the carrier substrate fixing device 104 and the picking up and transferring device 105 to work and move, they are existing mature technologies and thus will be not described in detail.

Fifth Embodiment

Figure 11:
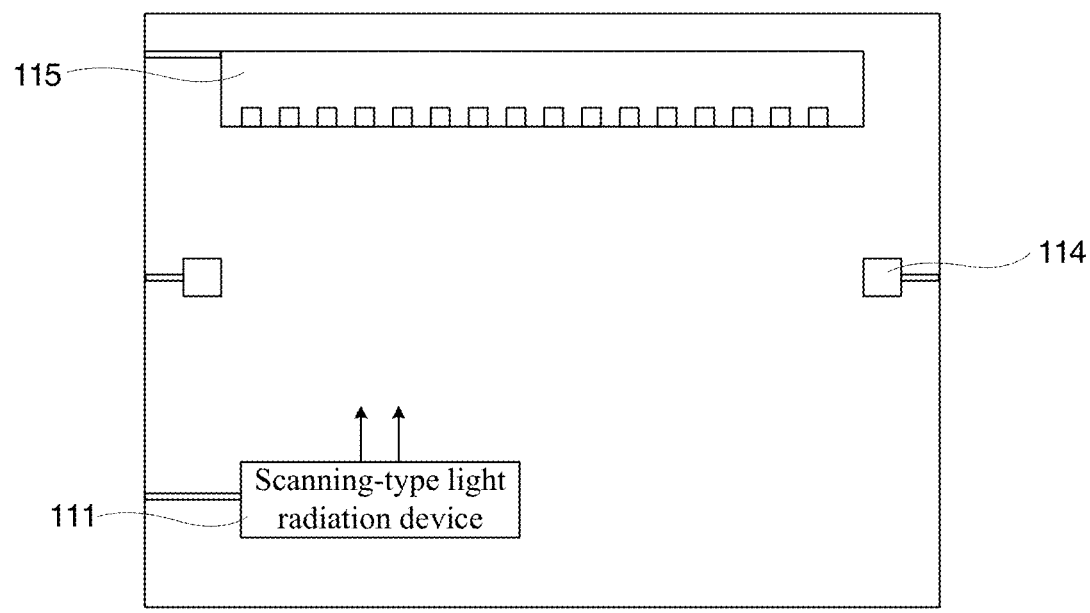
FIG. 11 is a schematic system architecture of a micro device transferring apparatus according to a fifth embodiment of the invention.

Referring to FIG. 11, a fifth embodiment of the invention provides a micro device transferring apparatus 110 including: a scanning-type light radiation device 111, a carrier substrate fixing device 114, and a picking up and transferring device 115.

The scanning-type light radiation device 111 for example includes a light radiation source such as an infrared radiation source or an ultraviolet radiation source, and configured for providing a scanning light beam to perform a two-dimensional scanning radiation. The carrier substrate fixing device 114 is configured for fixing a carrier substrate between the scanning-type light radiation device 111 and the picking up and transferring device 115. The carrier substrate typically includes a transparent base and multiple micro-LED devices or other micro devices such as diodes, transistors, ICs, MEMSs adhered onto the transparent base by the light radiation activated adhesiveness-loss layer. The picking up and transferring device 115 is configured for picking up the micro devices in the areas irradiated by the scanning light beam on the light radiation activated adhesiveness-loss layer of the carrier substrate, and transferring the picked up micro devices to a receiving substrate. In the illustrated embodiment, the picking up and transferring device 115 preferably adopts a vacuum absorbing device with micro adsorption pores, which can achieve the absorbing and picking up in one-to-many manner (i.e., does not design transfer heads additionally), and thereby can reduce the alignment difficulty and cost of mass transfer. Of course, the picking up and transferring device 115 may employ the existing transfer heads for absorbing and picking up in one-to-one manner instead, and achieve the picking up of micro devices by electrostatic adsorption or magnetic adsorption, but the cost of this approach is relatively high. In addition, it is noted that, if the picking up and transferring device 115 employs the vacuum absorbing device, since it can realize absorbing and picking up in one-to-many manner, so that it is compatible with picking up and absorbing of micro device arrays with different micro device spacings and thus can avoid the issue of reproducing new transfer heads resulting from different micro device spacings for micro device arrays, and thereby has a wide application range. Furthermore, as to driving mechanisms for driving the scanning-type light radiation device 111, the carrier substrate fixing device 114 and the picking up and transferring device 115 to work and move, they are existing mature technologies and thus will be not described in detail. Furthermore, it is noted that, since the scanning-type light radiation device 111 is used, there is no need of mask to perform local irradiation on the light radiation activated adhesiveness-loss layer of the carrier substrate.

Finally, the term "micro" in the foregoing embodiments of the invention may refer to the descriptive size of certain devices or structures and is meant to refer to the scale of 1 to 100 micrometers. In addition, the variable mask 1030 may be applied to the foregoing third embodiment and is fixed by the mask fixing device 93 for use.

In summary, the foregoing description merely illustrates some preferred embodiments of the invention and is not intended to limit the scope of the invention. Although the invention has been disclosed in the above preferred embodiments, it is not intended to limit the invention. Any person skilled in the art can make some amendments or modifications as equivalent embodiments according to the above disclosed technical contents without departing from the technical scope of the invention. As long as they are without departing from the technical scope of the invention, any simple amendments, equivalent changes and modifications to the above embodiments according to the technical essence of the invention are still within the technical scope of the invention.

What is claimed is:

1. A micro device transferring method comprises:

providing a carrier substrate, wherein the carrier substrate comprises a transparent base, a light radiation activated adhesiveness-loss layer disposed on a first surface of the transparent base, and a plurality of micro devices arranged in an array on the light radiation activated adhesiveness-loss layer;

locally irradiating the light radiation activated adhesiveness-loss layer from a second surface of the transparent base to thereby reduce adhesiveness of a plurality of target areas of the light radiation activated adhesiveness-loss layer to the micro devices respectively located in the plurality of target areas, wherein the plurality of target areas are areas are corresponding to the micro devices to be transferred, and other areas of the light radiation activated adhesiveness-loss layer located outside the plurality of target areas have a stronger adhesiveness than the plurality of target areas after the locally irradiating;

applying a pickup force to the micro devices located in the plurality of target areas as well as the micro devices located in the other areas outside the plurality of target areas, picking up the micro devices located in the plurality of target areas by the pickup force while maintaining the micro devices located in the other areas being not picked up by the pickup force owning to the stronger adhesiveness; and aligning the micro devices being picked up with corresponding locations of a receiving substrate, and then releasing the micro devices being picked up onto the receiving substrate.

2. The micro device transferring method as claimed in claim 1, wherein the step of providing a carrier substrate comprises:

providing a micro device layer formed on a first base;

providing the light radiation activated adhesiveness-loss layer formed on the transparent base;

bonding the micro device layer with the light radiation activated adhesiveness-loss layer to obtain a bonded structure, wherein the first base is located at a side of the micro device layer facing away from the light radiation activated adhesiveness-loss layer, and the transparent base is located at a side of the light radiation activated adhesiveness-loss layer facing away from the micro device layer;

stripping off the first base from the bonded structure to obtain a stripped structure;

dividing the micro device layer of the stripped structure into the plurality of micro devices arranged in an array on the light radiation activated adhesiveness-loss layer, to obtain the carrier substrate.

3. The micro device transferring method as claimed in claim 1, wherein the step of providing a carrier substrate comprises:

providing the plurality of micro devices formed on a first base;

providing the light radiation activated adhesiveness-loss layer formed on the transparent base;

bonding the plurality of micro devices with the light radiation activated adhesiveness-loss layer to obtain a bonded structure, wherein the first base is located at a side of the plurality of micro devices facing away from the light radiation activated adhesiveness-loss layer, and the transparent base is located at a side of the light radiation activated adhesiveness-loss layer facing away from the plurality of micro devices; and stripping off the first base from the bonded structure, to obtain the carrier substrate.

4. The micro device transferring method as claimed in claim 1, wherein light radiation activated adhesiveness-loss layer is one of an ultraviolet radiation activated adhesiveness-loss layer and an infrared radiation activated adhesiveness-loss layer.

5. The micro device transferring method as claimed in claim 1, wherein the step of locally irradiating the light radiation activated adhesiveness-loss layer from a second surface of the transparent base comprises:

using a surface light radiation cooperating with a mask to achieve locally irradiating the light radiation activated adhesiveness-loss layer from the second surface of the transparent base, or using a radiation light beam to perform a two-dimensional scanning onto the light radiation activated adhesiveness-loss layer from the second surface of the transparent base.

6. The micro device transferring method as claimed in claim 1, wherein the pickup force is an adsorption force provided by a vacuum absorbing device.

7. The micro device transferring method as claimed in claim 6, wherein each of the micro devices is a micro-LED device having a size in a range of 1 micrometer to 100 micrometers.

8. The micro device transferring method as claimed in claim 1, wherein the step of locally irradiating the light radiation activated adhesiveness-loss layer from a second surface of the transparent base comprises:

using a surface light radiation cooperating with a variable mask to achieve locally irradiating the light radiation activated adhesiveness-loss layer from the second surface of the transparent base, and positions of light transmitting portions of the variable mask being variable.

9. A micro device transferring apparatus comprises:

a light radiation device, configured for providing a surface light radiation;

a first fixer, configured for fixing a carrier substrate;

a second fixer, configured for fixing a mask on an optical path of the surface light radiation to make the surface light radiation locally irradiate the carrier substrate; and an absorbing device, configured for picking up micro devices located in a plurality of target areas irradiated by the surface light radiation on the carrier substrate and transferring the micro devices being picked up onto a receiving substrate;

wherein the mask is a variable mask located between the light radiation device and the first fixer and configured for allowing the surface light radiation to locally irradiate the carrier substrate, and positions of light transmitting portions of the variable mask are variable.

10. The micro device transferring apparatus as claimed in claim 9, wherein the light radiation device comprises one of an ultraviolet radiation source and an infrared radiation source.

11. The micro device transferring apparatus as claimed in claim 9, wherein the variable mask comprises an optical switch.

12. The micro device transferring apparatus as claimed in claim 11, wherein the optical switch is a liquid crystal light valve array.

13. The micro device transferring apparatus as claimed in claim 9, wherein the micro device transferring apparatus is applied for transferring micro devices on the carrier substrate containing a light radiation activated adhesiveness-loss layer, and adhesiveness of the plurality of target areas is reduced after being irradiated by the surface light radiation.

14. The micro device transferring apparatus as claimed in claim 9, wherein the carrier substrate comprises a transparent base, a light radiation activated adhesiveness-loss layer disposed on a first surface of the transparent base, and a plurality of the micro devices arranged in an array on a side of the light radiation activated adhesiveness-loss layer facing away from the transparent base;

the absorbing device is concretely configured for: applying a pickup force to the micro devices located in the plurality of target areas as well as the micro devices located in other areas outside the plurality of target areas, picking up the micro devices in the plurality of target areas by the pickup force while maintaining the micro devices located in the other areas being not picked up by the pickup force resulting from the other areas having a stronger adhesiveness than the plurality of target areas after being irradiated by the surface light radiation, and transferring the micro devices being picked up onto the receiving substrate.

15. The micro device transferring apparatus as claimed in claim 14, wherein each of the micro devices is a micro-LED device having a size in a range of 1 micrometer to 100 micrometers, and the absorbing device is a vacuum absorbing device with micro adsorption pores.

16. A micro device transferring apparatus comprises:

a fixer, configured for fixing a carrier substrate, wherein the carrier substrate comprises a transparent base, a light radiation activated adhesiveness-loss layer disposed on a first surface of the transparent base, and a plurality of micro devices arranged in an array on a side of the light radiation activated adhesiveness-loss layer facing away from the transparent base;

a scanning-type light radiation device, configured for providing a radiation light beam to perform a two-dimensional scanning on the carrier substrate from a second surface of the transparent base to thereby reduce adhesiveness of a plurality of target areas of the light radiation activated adhesiveness-loss layer to the micro devices respectively located in the plurality of target areas, wherein the plurality of target areas are areas are corresponding to the micro devices to be transferred, and other areas of the light radiation activated adhesiveness-loss layer located outside the plurality of target areas have a stronger adhesiveness than the plurality of target areas irradiated by the radiation light beam; and an absorbing device, configured for applying a pickup force to the micro devices located in the plurality of target areas as well as the micro devices located in the other areas outside the plurality of target areas, picking up the micro devices in the plurality of target areas by the pickup force while maintaining the micro devices located in the other areas being not picked up by the pickup force owning to the stronger adhesiveness, and transferring the micro devices being picked up onto a receiving substrate.

17. The micro device transferring apparatus as claimed in claim 16, wherein the scanning-type light radiation device comprises one of an ultraviolet radiation source and an infrared radiation source.

18. The micro device transferring apparatus as claimed in claim 16, wherein each of the micro devices is a micro-LED device having a size in a range of 1 micrometer to 100 micrometers, and the absorbing device is a vacuum absorbing device with micro adsorption pores.

* * * * *